(12) United States Patent
Yeh et al.

(10) Patent No.: US 8,329,484 B2
(45) Date of Patent: Dec. 11, 2012

(54) PHOSPHOR WITH $CE^{3+}/CE^{3+}$, $LI^+$ DOPED LUMINESCENT MATERIALS

(75) Inventors: Chiao-Wen Yeh, Taitung (TW); Ru-Shi Liu, Shulin (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 151 days.

(21) Appl. No.: 12/938,221

(22) Filed: Nov. 2, 2010

(65) Prior Publication Data

US 2012/0104929 A1    May 3, 2012

(51) Int. Cl.
*H01L 21/00* (2006.01)
*H01L 33/00* (2010.01)

(52) U.S. Cl. .......................... 438/29; 257/98

(58) Field of Classification Search .............. 438/22–31, 438/65, 116; 252/301.4 F; 257/88, 98, E33.056–E33.059
See application file for complete search history.

(56) References Cited

U.S. PATENT DOCUMENTS

| | | | | |
|---|---|---|---|---|
| 5,998,925 | A * | 12/1999 | Shimizu et al. | 313/503 |
| 6,649,946 | B2 | 11/2003 | Bogner et al. | |
| 7,391,060 | B2 * | 6/2008 | Oshio | 252/301.4 F |
| 7,537,710 | B2 * | 5/2009 | Oshio | 252/301.4 F |
| 7,611,641 | B2 * | 11/2009 | Schmidt et al. | 252/301.4 F |
| 2006/0220047 | A1 | 10/2006 | Nagatomi et al. | |
| 2011/0304261 | A1 * | 12/2011 | Winkler et al. | 313/503 |

FOREIGN PATENT DOCUMENTS

WO    WO-2006/061778 A1    6/2006

OTHER PUBLICATIONS

Rong-Jun Xie et al., "Photoluminescence of $(Ba_{1-x}Eu_x)Si_6N_8O$ ($0.005 \leq x \leq 0.2$) phosphors", Journal of Luminescence 130 (2010), 2009 Elsevier B.V., pp. 266-269.

Florian Stadler et al., "Synthesis, Crystal Structure and Solid-State NMR Spectroscopic Investigation of the Oxonitridosilicate $BaSi_6N_8O$", 2005, Wiley-VCH, pp. 1773-1778.

C.J. Duan et al., "Preparation, Electronic Structure, and Photoluminescence Properties of $Eu^{2+}$- and $Ce^{3+}/Li^+$-Activated Alkaline Earth Silicon Nitride $MsiN_2$ (M = Sr, Ba)", Chem. Mater. © XXXX American Chemical Society, Published on Web Jan. 3, 2008, pp. A-I.

R. Le Toquin et al., "Red-Emitting Cerium-Based Phosphor Materials for Solid-State Lighting Applications", Science Direct, 2006 Elsevier B.V., Chemical Physics Letters 423 (2006) pp. 352-356.

Florian Stadler et al., "$SrSi_6N_8$—A Reduced Nitridosilicate with a Si-Si Bond", 2005 Wiley-VCH, Angew. Chem. Int. Ed. 2005, 44, pp. 657-570.

Florian Stadler et al., "The Reduced Nitridosilicate $BaSi_6N_8$", 2007, Wiley-VCH, InterScience, pp. 589-592.

(Continued)

*Primary Examiner* — Calvin Lee
(74) *Attorney, Agent, or Firm* — Haynes and Boone, LLP (57) ABSTRACT

The present disclosure provides an illuminating system including a light emitting device and a luminescent material disposed approximate the light-emitting device. The luminescent material includes a strontium silicon nitride ($SrSi_6N_8$) doped by one of cerium ($Ce^{3+}$) and cerium ($Ce^{3+}$) and lithium ($Li^+$).

17 Claims, 8 Drawing Sheets

OTHER PUBLICATIONS

Y.Q. Li et al., "The Effect of Replacement of Sr by Ca on the Structural and Luminescence Properties of the Red-Emitting $Sr_2Si_5N_8:Eu^{2+}$ LED Conversion Phosphor", Journal of Solid State Chemistry 181 (2008), Elsevier, Science Direct, pp. 515-524.

Kousuke Shioi et al., "Luminescence Properties of $SrSi_6N_8:Eu^{2+}$" Springer Science+Business Media, LLC 2008, J Mater Sci (2008) 43:5659-5661.

* cited by examiner

| | Mixing composition (% by weight) | | | | | | | | |
|---|---|---|---|---|---|---|---|---|---|
| Example | Compound | Sr3N2 | Si3N4 | EuN | CeO2 | Li3N | Temperature | Time(h) | Pressure(MPa) |
| 1 | 168:Ce0.01 | 25.37 | 74.17 | | 0.46 | | 1900 | 3 | 0.9 |
| 2 | 168:Ce0.01,Li0.01 | 25.16 | 74.29 | | 0.46 | 0.09 | 1900 | 3 | 0.9 |
| 3 | 168:Ce0.1,Li0.1 | 20.47 | 74.06 | | 4.55 | 0.92 | 1900 | 3 | 0.9 |
| 4 | 168:Ce0.05,Li0.05 | 23.08 | 74.19 | | 2.27 | 0.46 | 1900 | 3 | 0.9 |
| 5 | 168 | 25.68 | 74.32 | | | | 1900 | 3 | 0.9 |
| 6 | 168 | 25.68 | 74.32 | | | | 1950 | 3 | 0.9 |
| 7 | 168:Ce0.01,Li0.01 | 25.16 | 74.29 | | 0.46 | 0.09 | 1950 | 3 | 0.9 |

| | Peak wavelength and intensity of excitation emission spectra | | | | |
|---|---|---|---|---|---|
| Example | Excitation wavelength (nm) | Excitation intensity | Emission wavelength (nm) | Emission intensity | Half Width at Half Maximum (HWHM) |
| 1 | 375 | 1.99E+08 | 452 | 2.03E+08 | 54 |
|   | 460 | 9.75E+07 | 627 | 1.03E+08 | 227 |
| 2 | 375 | 2.02E+08 | 452 | 2.09E+08 | 53 |
|   | 460 | 1.19E+08 | 627 | 1.26E+08 | 198 |
| 3 | 375 | 2.45E+08 | 474 | 2.49E+08 | 146 |
|   | 460 | 7.79E+07 | 627 | 8.18E+07 | 239 |
| 4 | 375 | 1.68E+08 | 456 | 1.74E+08 | 114 |
|   | 460 | 8.76E+07 | 627 | 9.15E+07 | 206 |
| 5 | 375 | 2.67E+07 | 454 | 2.69E+07 | 41 |
| 6 | 375 | 2.49E+07 | 454 | 25582300 | 40 |
| 7 | 375 | 7.29E+07 | 454 | 7.49E+07 | 50 |
|   | 460 | 3.91E+07 | 627 | 4.04E+07 | 246 |

PHOSPHOR WITH CE³⁺/CE³⁺, LI⁺ DOPED LUMINESCENT MATERIALS

BACKGROUND

Light-emitting diode (LED) lighting typically uses nitridosilicates and oxonitridosilicates materials to enhance color rendering index (CRI) and chemical stability. In particular, nitridosilicates have high condensed frameworks, and thus, have stable chemical structures and exhibit thermal stability. Following crystal field splitting theory and nephelauxetic effects, nitride phosphors can emit more red light than oxide phosphors. For example, a blue-emitting diode can be used to excite a nitride phosphor to provide red light. U.S. Pat. No. 6,649,946 discloses nitride phosphors that expose yellow to red emitting phosphor, such as $(Ca,Sr,Ba)_xSi_yN_z$:Eu (z=2/3x+4/3y) (for example, $(Ca,Sr,Ba)_{2-x}Si_5N_8$:Eu$_x$). These types of phosphors are synthesized at normal pressure. It has been observed that since nitride phosphors corresponding excitation spectrum does not match the emission spectrum of the blue light-emitting LED, such as an indium gallium nitride (InGaN) LED, existing nitride phosphors less efficient as red light-emitting phosphors than desirable. Therefore, a nitride phosphor material having a proper excitation spectrum and a method of making the same to enhance LED color shifting is needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 1:
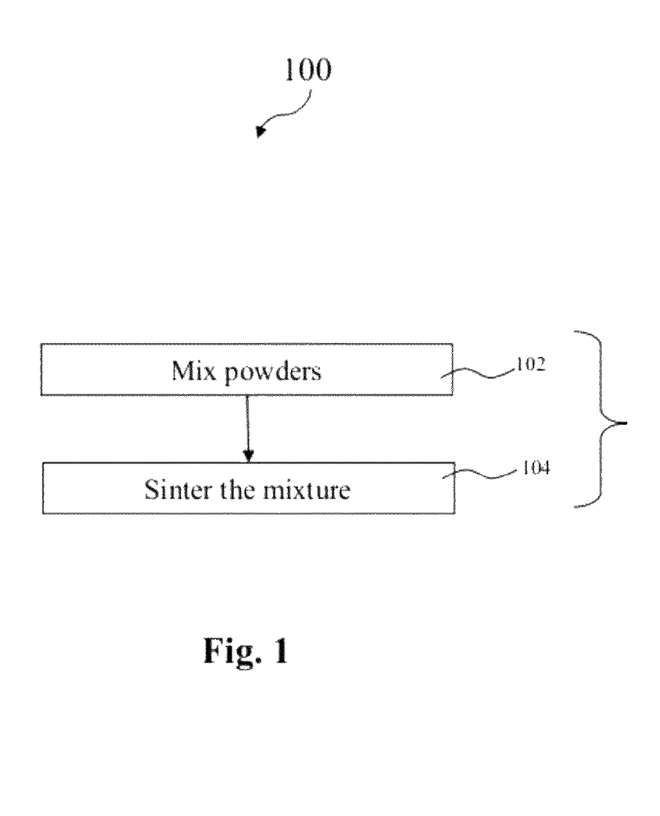
FIG. 1 is a flowchart of a method for forming a luminescent material constructed according to various aspects of the present disclosure in one or more embodiments.

FIG. 1 is a flowchart of a method 100 for making a luminescent material (or phosphor) constructed according to various aspects of the present disclosure. The present disclosure provides a luminescent material having desired excitation spectrum and emission spectrum to enhance a radiation source's performance. With further reference to FIGS. 3-7, the luminescent material and method of making the same are collectively described below.

The method 100 begins by mixing precursors stoichiometrically at step 102. The precursors are provided in powders. In one embodiment, the precursors are grounded in a mortar under argon atmosphere. The precursors include strontium nitride ($Sr_3N_2$), silicon nitride ($Si_3N_4$), and cerium oxide ($CeO_2$). The powdered strontium nitride, silicon nitride, and cerium oxide are mixed according to certain composition ratios, forming a mixture. For example, powdered strontium nitride, silicon nitride, and cerium oxide are mixed in percentages by weight (or weight percentages) as 25.37, 74.17, and 0.46, respectively, as shown in the first row of a table 106 in FIG. 3.

The method 100 proceeds to step 104 by sintering the mixture, forming a nitridosilicate (or silicon nitride) luminescent material (phosphor) in pink powder. The nitridosilicate luminescent material includes strontium silicon nitride doped by cerium ($Ce^{3+}$) (or cerium activated strontium silicon nitride) having a formula of $SrSi_6N_8$:$Ce^{3+}$. Particularly, the luminescent material has various compositions defined in a compositional formula as $Sr_{1-x}Si_6N_8$:$Ce^{3+}_x$, where x is a parameter defining the relative composition contents of strontium and cerium. In one embodiment, the parameter x ranges between about 0.01 and about 0.5. In another embodiment, the parameter x ranges between about 0.01 and about 0.1. In the present embodiment, associated with the first row of table 106 of FIG. 3, the parameter x is 0.01. In this case, the corresponding compositional formula is $Sr_{0.99}Si_6N_8$:$Ce^{3+}_{0.01}$.

Figure 3:
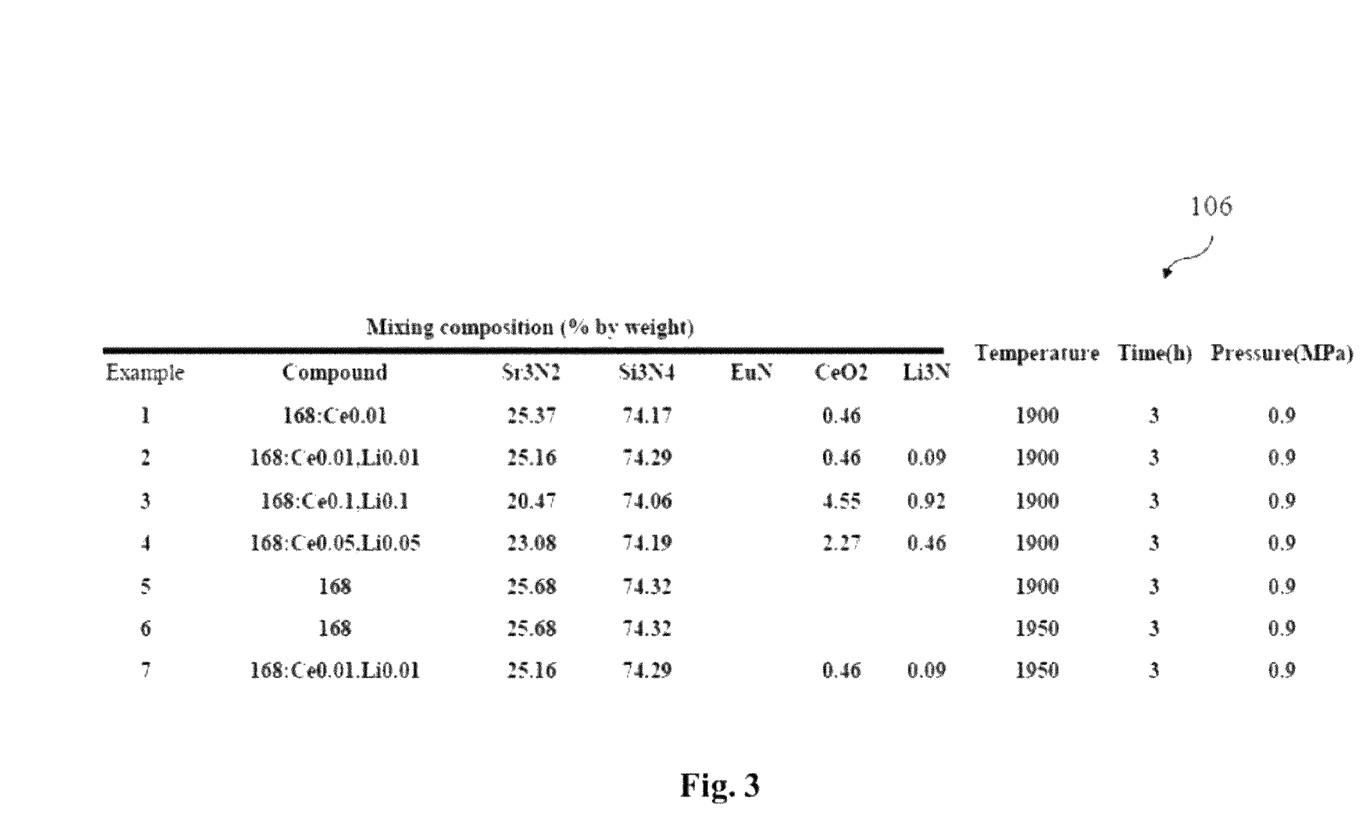
FIG. 3 is a table of compositions and parameters for making the luminescent material by the method of FIG. 1 in various embodiments.

The sintering of the mixture at step 104 is implemented in a nitrogen atmosphere with a high temperature and a high pressure. In one embodiment, the high temperature ranges between about 1800° C. and about 2000° C. In another embodiment, the high pressure is about 0.90 MPa or higher. In the present embodiment, the high temperature is about 1900° C., and the high pressure is about 0.90 MPa as shown in the first row of table 106. The sintering at step 104 has a duration greater than about 0.5 hour. In the present embodiment, the sintering duration is about 3 hours as shown in the first row of table 106.

Figure 4:
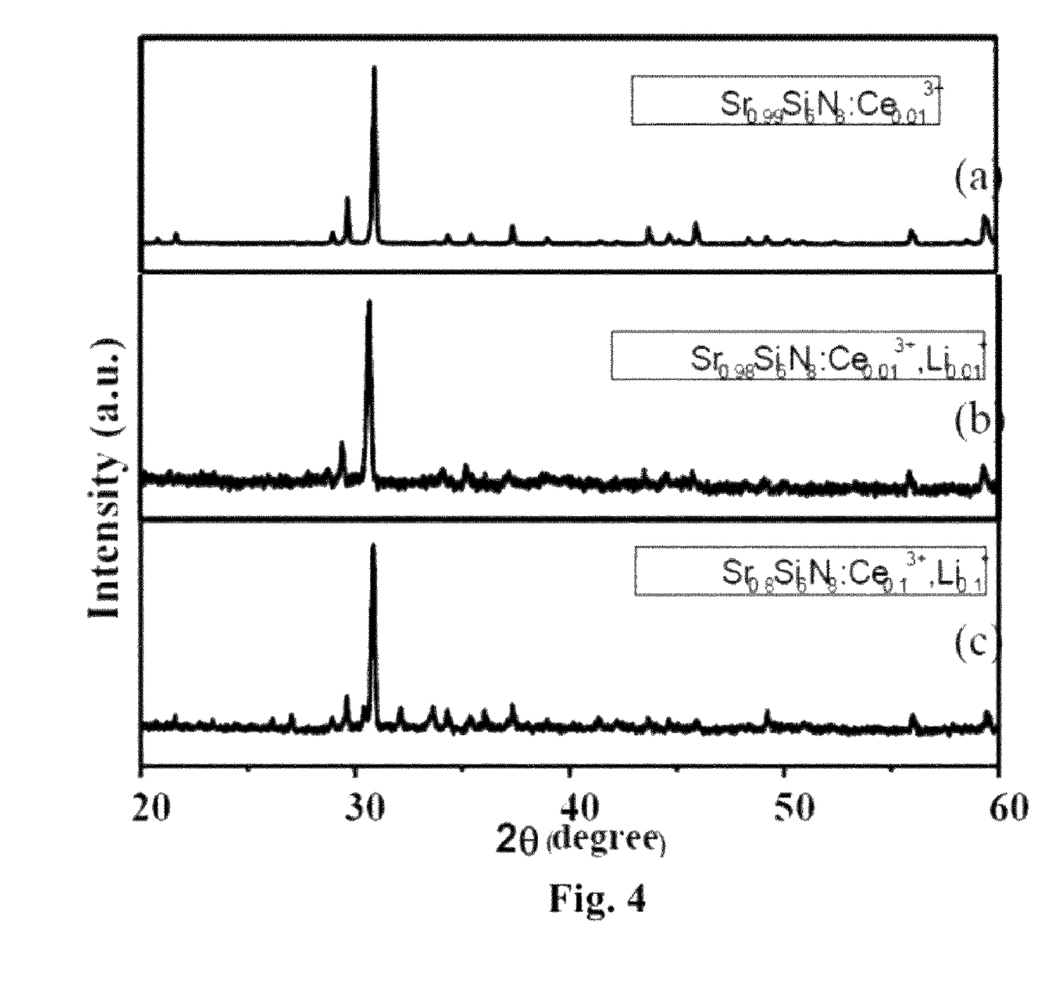
FIG. 4 includes charts of characterizing the luminescent materials in various embodiments.

In one example, the formed nitridosilicate luminescent material $Sr_{1-x}Si_6N_8$:$Ce^{3+}_x$ has been investigated by x-ray using Bragg diffraction techniques as illustrated in FIG. 4(a). The luminescent material of FIG. 4(a) is formulated as $Sr_{1-x}Si_6N_8$:$Ce^{3+}_x$ with x being 0.01, or $Sr_{0.99}Si_6N_8$:$Ce^{3+}_{0.01}$, corresponding to the luminescent material formed using the compositions and parameters provided in the first row of table 106 of FIG. 3. The diffraction pattern is drawn as the scattering intensity (in arbitrary units) versus 2θ, where θ is the scattering angle. The Bragg peak in the diffraction pattern indicates that the corresponding $Sr_{1-x}Si_6N_8$:$Ce^{3+}_x$ luminescent material is in a pure phase.

The present disclosure also provides another embodiment of the nitridosilicate luminescent material and method of making the same as described below. Still referring to FIG. 1, the method 100, in this embodiment, includes step 102 for mixing various precursors stoichiometrically. The precursors are provided in powder. In one embodiment, the precursors are grounded in a mortar under argon atmosphere. The precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed according to certain composition ratios. In one example, powdered strontium nitride, silicon nitride, cerium oxide, and lithium nitride are mixed in weight percentages as 25.16, 74.29, 0.46, and 0.09, respectively, as shown in the second row of table 106 of FIG. 3.

The method 100 includes step 104 for sintering the mixture, forming a nitridosilicate luminescent material as pink powder. The nitridosilicate luminescent material includes strontium silicon nitride co-doped by cerium ($Ce^{3+}$) and lithium ($Li^+$) and has a formula of $SrSi_6N_8:Ce^{3+}, Li^+$. Particularly, the luminescent material has various compositions defined in a compositional formula as $Sr_{1-2x}Si_6N_8:Ce^{3+}_x, Li^+_x$, where x is a parameter defining the relative composition contents of strontium, cerium, and lithium. In one embodiment, the parameter x ranges between about 0.01 and about 0.5. In another embodiment, the parameter x ranges between about 0.01 and about 0.1. In the present embodiment associated with the second row of table 106 of FIG. 3, the parameter x is 0.01. In this case, the corresponding nitridosilicate luminescent material has a compositional formula of $Sr_{0.98}Si_6N_8:Ce^{3+}_{0.01}, Li^+_{0.01}$.

The sintering of the mixture at step 104 is implemented in a nitrogen atmosphere with a high temperature and a high pressure. In one embodiment, the high temperature ranges between about 1800° C. and about 2000° C. In another embodiment, the high pressure is about 0.90 MPa or higher. In the present embodiment, the high temperature is about 1900° C., and the high pressure is about 0.90 MPa as shown in the second row of the mixing composition table in FIG. 3. The sintering at step 104 has a sintering duration greater than about 0.5 hour. In the present embodiment, the sintering duration is about 3 hours as shown in the second row of table 106. In one example, the formed nitridosilicate luminescent material $Sr_{1-2x}Si_6N_8:Ce^{3+}_x$, (x is 0.01) has been investigated by x-ray using Bragg diffraction techniques as illustrated in FIG. 4(b). The diffraction pattern is drawn as the scattering intensity (in arbitrary units) versus 2θ, where θ is the scattering angle. The Bragg peak in the diffraction pattern indicates that the $Sr_{1-2x}Si_6N_8:Ce^{3+}_x, Li^+_x$, luminescent material is in a pure phase.

Other examples are provided in FIG. 3 according to various embodiments of the present disclosure. One example is shown in the third row of table 106. The precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed in weight percentages of 20.47, 74.06, 4.55, and 0.92, respectively. In present example, the sintering temperature is about 1900° C.; the nitrogen pressure is about 0.90 MPa; and the sintering duration is about 3 hours. The formed nitridosilicate luminescent material $Sr_{1-2x}Si_6N_8:Ce^{3+}_x, Li^+_x$ (x is 0.1) has been investigated by x-ray using Bragg diffraction techniques as illustrated in FIG. 4(c). The diffraction pattern is drawn as the scattering intensity (in arbitrary units) versus 2θ. The Bragg peak in the diffraction pattern indicates that the $Sr_{0.8}Si_6N_8:Ce^{3+}_{0.1}, Li^+_{0.1}$ luminescent material is in a pure phase.

Another example is shown in the fourth row of table 106. The precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed in weight percentages of 23.08, 74.19, 2.27, and 0.46, respectively. In present example, the sintering temperature is about 1900° C.; the nitrogen pressure is about 0.90 MPa; and the sintering duration is about 3 hours. The formed nitridosilicate luminescent material is thus represented by a formula of $Sr_{1-2x}Si_6N_8:Ce^{3+}_x, Li^+_x$, where x is about 0.05.

Another example is shown in the last row of table 106. The precursors includes strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed in weight percentages of 25.16, 74.29, 0.46, and 0.09, respectively. In present example, the sintering temperature is about 1950° C.; the nitrogen pressure is about 0.90 MPa; and the sintering duration is about 3 hours. The formed nitridosilicate luminescent material is thus represented by formula of $Sr_{1-2x}Si_6N_8:Ce^{3+}_x, Li^+_x$, where x is about 0.01.

The nitridosilicate (or nitride) phosphor formed by the method 100, such as the nitridosilicate materials described above, is cerium ($Ce^{3+}$) doped, or cerium and lithium ($Ce^{3+}, Li^+$) co-doped. The above described nitridosilicate materials described above, and formed by the method 100, can emit red light under blue excitation, and are therefore referred to as blue-to-red nitridosilicate phosphors doped by $Ce^{3+}$, or $Ce^{3+}$ and $Li^+$. In one embodiment, the blue-to-red nitridosilicate phosphors includes an excitation spectrum peak ranging from 430 nm to 490 nm. The blue-to-red nitridosilicate phosphors use cerium oxide ($CeO_2$) as an activator, or cerium oxide ($CeO_2$) and lithium nitride ($Li_3N$) as an activator.

The present disclosure also provides another embodiment of the blue-to-red nitridosilicate (or nitride) phosphor doped by $Ce^{3+}$ or $Ce^{3+}, Li^+$, which emits red light under blue excitation. The blue-to-red nitridosilicate phosphor is formed by the method 100 according to one embodiment. Particularly, the blue-to-red nitridosilicate phosphor is synthesized at high pressure. The $Ce^{3+}$-doped (or $Ce^{3+},Li^+$-doped) nitridosilicate phosphor further emits blue light under UV light excitation. The $Ce^{3+}$-doped (or $Ce^{3+},Li^+$-doped) nitridosilicate phosphor has a composition formula of $M_{x-z}Si_yN_{2/3x+11/9y}:RE_z$, where M=Ca, Sr, or Ba; parameters x, y and z satisfy 0<z<x<y; and RE is rare earth element(s) $Ce^{3+}$, or $Ce^{3+}$ and $Li^+$.

In one embodiment, the nitridosilicate phosphor includes cerium doped ($Ce^{3+}$) strontium nitridosilicate, such as $Sr_{1-x}Si_6N_8:Ce^{3+}_x$. The parameter x ranges between about 0.01 to about 0.1 in one example. In another embodiment, the nitridosilicate phosphor includes cerium and lithium-co-doped ($Ce^{3+}, Li^+$) strontium nitridosilicate formulated as $Sr_{1-2x}Si_6N_8:Ce^{3+}_x, Li^+_x$. The parameter x ranges between about 0.01 to about 0.5 in one example. The parameter x may range between about 0.01 to about 0.1 in another example. In yet another embodiment, the nitridosilicate phosphor includes cerium and lithium-doped ($Ce^{3+}, Li^+$) nitridosilicate formulated as $M_{x-z}Si_yN_{2/3x+11/9y}:RE_z$. In various examples, M=Ca, Sr, or Ba; parameters x, y and z satisfy 0<z<x<y; and RE includes $Ce^{3+}$, or $Ce^{3+}$ and $Li^+$.

Various advantages may be present in one or more embodiments of the nitridosilicate phosphor ($Sr_{1-x}Si_6N_8:Ce^{3+}_x$ or $Sr_{1-2x}Si_6N_8:Ce^{3+}_x, Li^+$, or $M_{x-z}Si_yN_{2/3+11/9y}:RE_z$). In one embodiment, the strontium nitridosilicate phosphor $Sr_{1-x}Si_6N_8:Ce^{3+}_x$ or $Sr_{1-2x}Si_6N_8:Ce^{3+}_x, Li^+_x$, emits red light under blue light excitation and emits blue light under ultraviolet (UV) light excitation. In furtherance of the embodiment, the ranges of the excitation wavelength are about 430 nm to about 490 nm, and about 300 nm to about 420 nm. In another embodiment, the strontium nitridosilicate phosphor, $Sr_{1-2x}Si_6N_8:Ce^{3+}{}_x, Li^+{}_x$, emits a broad emission band in the wavelength of about 550 nm to about 800 nm, and about 400 nm to about 600 nm. Furthermore, the strontium nitridosilicate phosphor, $Sr_{1-2x}Si_6N_8:Ce^{3+}{}_x, Li^+{}_x$, or $Sr_{1-2x}Si_6N_8:Ce^{3+}{}_x, Li^+{}_x$, is the first $Ce^{3+}$-doped nitride phosphor that emits red light under blue excitation. Particularly, this strontium nitridosilicate phosphor has an excitation spectrum with a peak ranging from 430 nm to 490 nm, such as about 460 nm, matching the emission spectrum of a LED having an emission peak at the same range, such as an indium gallium nitride (InGaN) LED that has an emission peak at about 460 nm, which will enhance conversion efficiency from blue light to red light.

LED lighting usually uses nitridosilicates and oxonitridosilicates to enhance color rendering index (CRT) and chemical stability due to high condensed frameworks. According to crystal field splitting theory, nitrides would get more red shift emitting than oxides. U.S. Pat. No. 6,649,946 discloses yellow to red emitting nitride phosphors doped by europium (Eu), such as $(Ca,Sr,Ba)_xSi_yN_z:Eu$ (z=2/3x+4/3y), which is synthesized at the normal pressure. In contrast, the blue-to-red nitridosilicate phosphor provided in the present disclosure is synthesized at a high pressure. Most existing red nitride phosphors are doped by Eu. In contrast, the blue-to-red nitridosilicate phosphor provided in the present disclosure is the first Ce-doped nitride phosphor that emits red light under blue light excitation. Besides, the blue-to-red nitridosilicate phosphor further emits blue light under UV light excitation.

Figure 5:
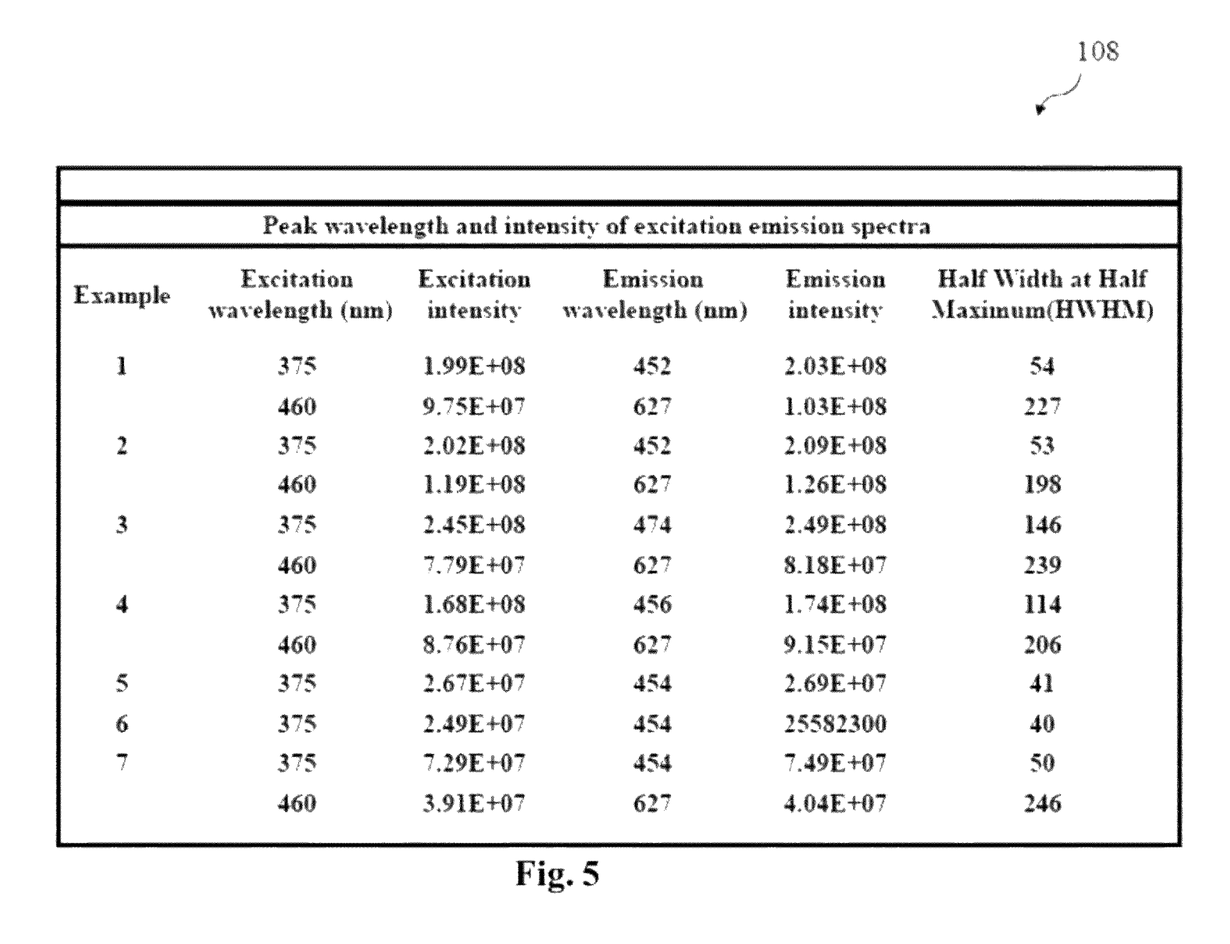
FIG. 5 is a table having characterization data of the luminescent materials in various embodiments.

FIG. 5 is a table 108 providing characteristic data of cerium-doped ($Ce^{3+}$), or cerium and lithium co-doped ($Ce^{3+}$, $Li^+$) nitridosilicate phosphor samples in various embodiments. Particularly, the table 108 provides peak wavelength and intensity of excitation and emission spectra of the seven examples listed in mixing composition table 106 of FIG. 3. The nitridosilicate phosphors in the seven examples are formed by the method 100 with the corresponding compositions listed in table 106 of FIG. 3. The seven examples labeled as 1, 2, 3, . . . , 7 in table 108 correspond, respectively, to the seven examples labeled as 1, 2, 3, . . . , 7 in table 106 of FIG. 3. Examples 1-4 and 7 are cerium doped blue-to-red nitridosilicate phosphors. Examples 5 and 6 are nitridosilicate phosphors without any cerium or lithium doping. Accordingly, the nitridosilicate phosphors in examples 5 and 6 emit blue light under UV light excitation, but are unable to emit red light under blue light excitation. Therefore, examples 5 and 6 are not cerium doped blue-to-red nitridosilicate phosphors. More specifically, table 108 includes excitation peak wavelength (in nanometer or nm), excitation peak intensity (in arbitrary units or a.u.), emission peak wavelength (nm), emission peak intensity (a.u.), and half width at half maximum (HWHM).

Example 1 is further described in detail according to table 108 for illustration. In example 1, the nitridosilicate phosphor is prepared by the method 100 having mixing compositions and sintering parameters provided in the first row of table 106 in FIG. 3. The nitridosilicate phosphor in example 1 is cerium ($Ce^{3+}{}_x$) doped strontium nitridosilicate phosphor with a formula of $Sr_{1-x}Si_6N_8:Ce^{3+}{}_x$, where x is 0.01 ($Sr_{0.99}Si_6N_8:Ce^{3+}{}_{0.01}$). The nitridosilicate phosphor in example 1 emits blue light under UV excitation. Particularly, the nitridosilicate phosphor in example 1 has an excitation peak wavelength at about 375 nm; an excitation peak intensity $1.99\times10^8$; an emission peak wavelength at 452 nm; an emission peak intensity $2.03\times10^8$; and HWHM at 54, as provided in the first row of table 108. The nitridosilicate phosphor in example 1 also emits red light under blue light excitation. Particularly, the nitridosilicate phosphor in example 1 has an excitation peak wavelength at about 460 nm; an excitation peak intensity $9.75\times10^7$; an emission peak wavelength at 627 nm; an excitation peak intensity $1.03\times10^8$; and HWHM at 227, as provided in the second row of table 108. So the nitridosilicate phosphor in example 1 is a blue-to-red nitridosilicate phosphor.

Figure 6:
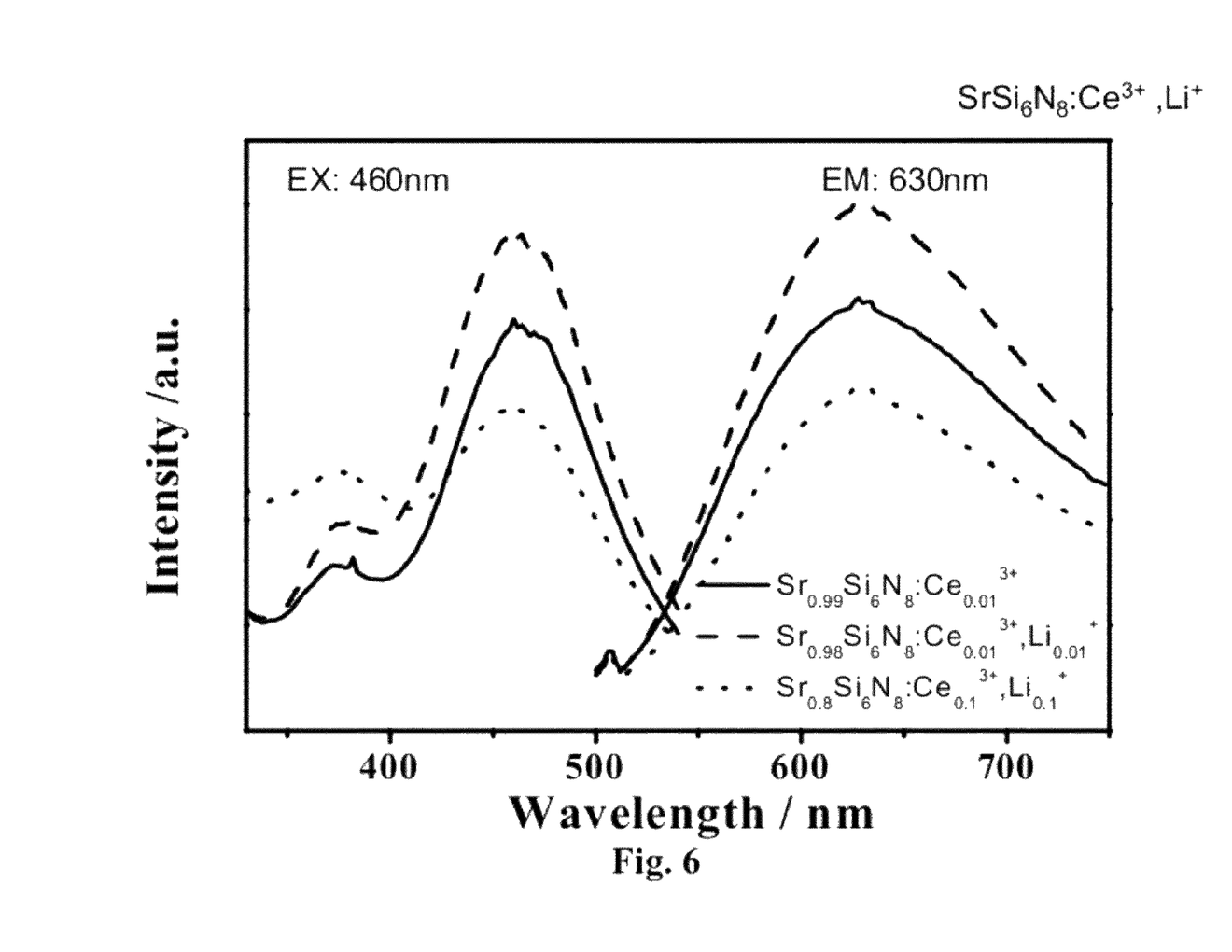
FIG. 6 is a chart of an excitation spectrum and an emission spectrum of the luminescent materials prepared by the method of FIG. 1 in various embodiments.

FIG. 6 further provides an excitation spectrum and an emission spectrum of the disclosed nitridosilicate phosphor in three examples. The horizontal axis is wavelength in nm, and the vertical axis is intensity in arbitrary units. The left curves are excitation spectrum, and the right curves are emission spectrums. Each nitridosilicate phosphor in the three examples emits red light under blue light excitation, and has an emission peak wavelength at about 630 nm and an excitation peak wavelength at about 460 nm. The solid line curves (represented by "_" in the legend) are for a cerium doped nitridosilicate phosphor with a formula of $Sr_{0.99}Si_6N_8:Ce^{3+}{}_{0.01}$ which corresponds to example 1 in table 106 of FIG. 3 and table 108 of FIG. 5. The broken line curves (represented by "- -" in the legend) are for a cerium and lithium co-doped nitridosilicate phosphor with a formula of $Sr_{0.98}Si_6N_8:Ce^{3+}{}_{0.01}Li^+{}_{0.01}$ which corresponds to example 2 in table 106 of FIG. 3 and table 108 of FIG. 5. The broken line curves (represented by " . . . " in the legend) are for a cerium and lithium co-doped nitridosilicate phosphor with a formula of $Sr_{0.8}Si_6N_8:Ce^{3+}{}_{0.1}, Li^+{}_{0.1}$, which corresponds to example 3 in table 106 of FIG. 3 and table 108 of FIG. 5.

Figure 7:
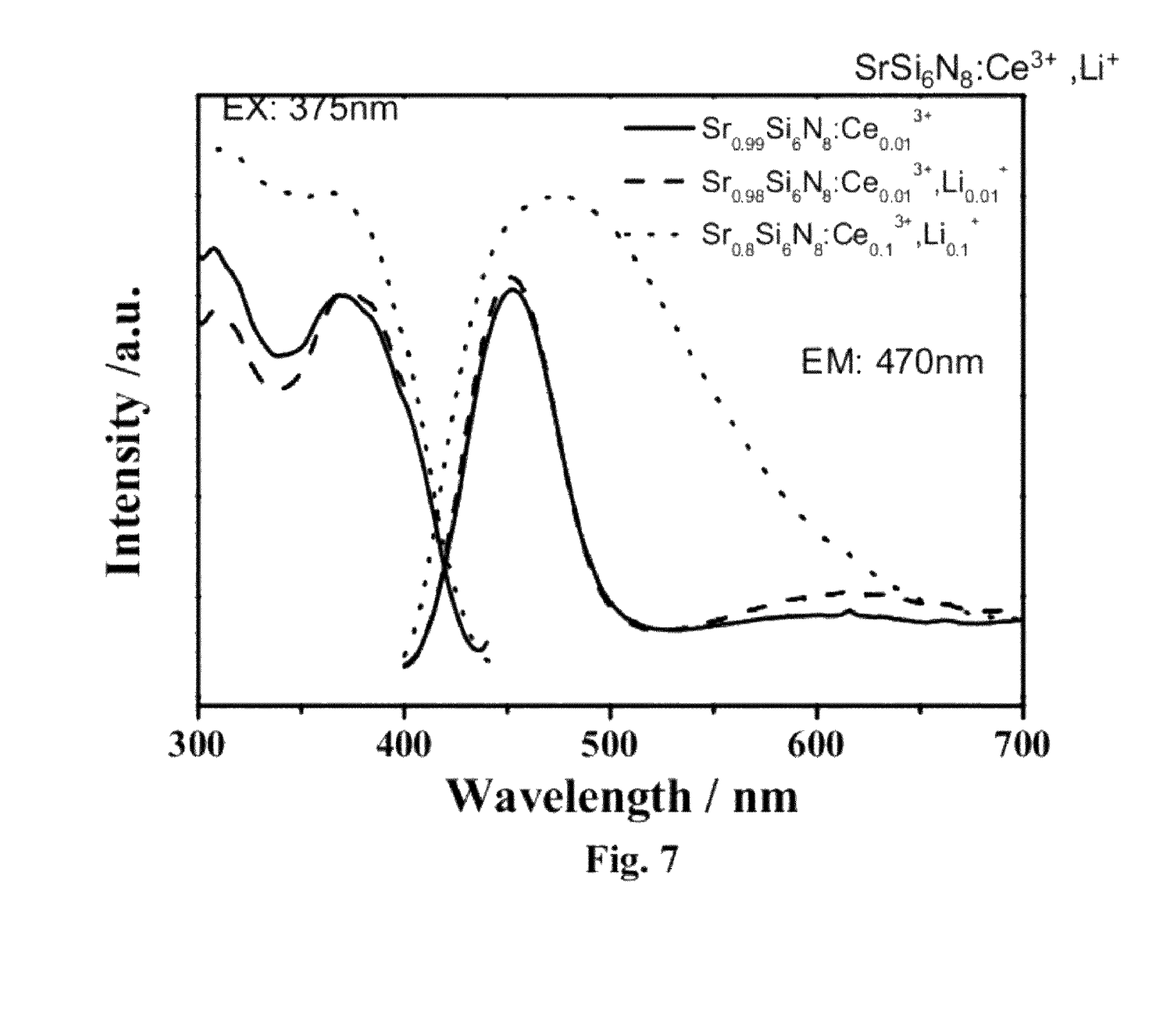
FIG. 7 is a chart of an excitation spectrum and an emission spectrum of the luminescent materials prepared by the method of FIG. 1 in various embodiments.

FIG. 7 further provides an excitation spectrum and an emission spectrum of the cerium doped nitridosilicate phosphor in the same three examples of FIG. 6. Similarly, the horizontal axis is wavelength in nm, and the vertical axis is intensity in arbitrary units. The left curves are excitation spectrum, and the right curves are emission spectrums. Each nitridosilicate phosphor in the three examples emits blue light under UV light excitation, and has an emission peak wavelength at about 470 nm and an excitation peak wavelength at about 375 nm. The curves are for the same three examples of FIG. 6. For example, the solid line curves (represented by "_" in the legend) are for a cerium doped nitridosilicate phosphor with the formula of $Sr_{0.99}Si_6N_8:Ce^{3+}{}_{0.01}$, which corresponds to example 1 in table 106 of FIG. 3 and table 108 of FIG. 5. The broken line curves (represented by "- -" in the legend) are for a cerium and lithium co-doped nitridosilicate phosphor with the formula of $Sr_{0.98}Si_6N_8:Ce^{3+}{}_{0.01}, Li^+{}_{0.01}$, which corresponds to example 2 in table 106 of FIG. 3 and table 108 of FIG. 5. The broken line curves (represented by " . . . " in the legend) are for a cerium and lithium co-doped nitridosilicate phosphor with the formula of $Sr_{0.8}Si_6N_8:Ce^{3+}{}_{0.1}, Li^+{}_{0.1}$, which corresponds to example 3 in table 106 of FIG. 3 and table 108 of FIG. 5.

Figure 2:
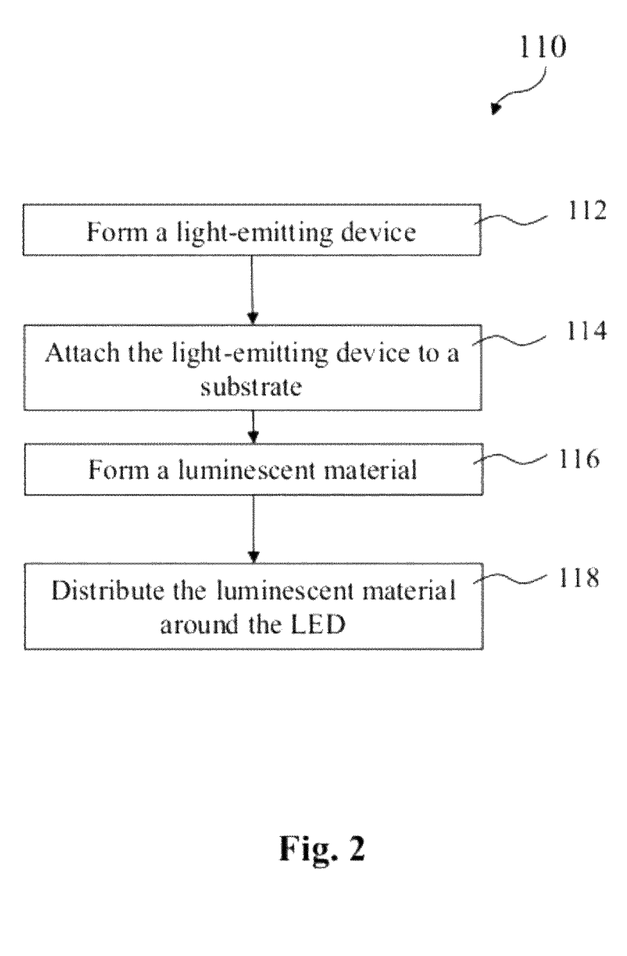
FIG. 2 is a flowchart of a method for forming a radiation device constructed according to various aspects of the present disclosure in one or more embodiments.
Figure 8:
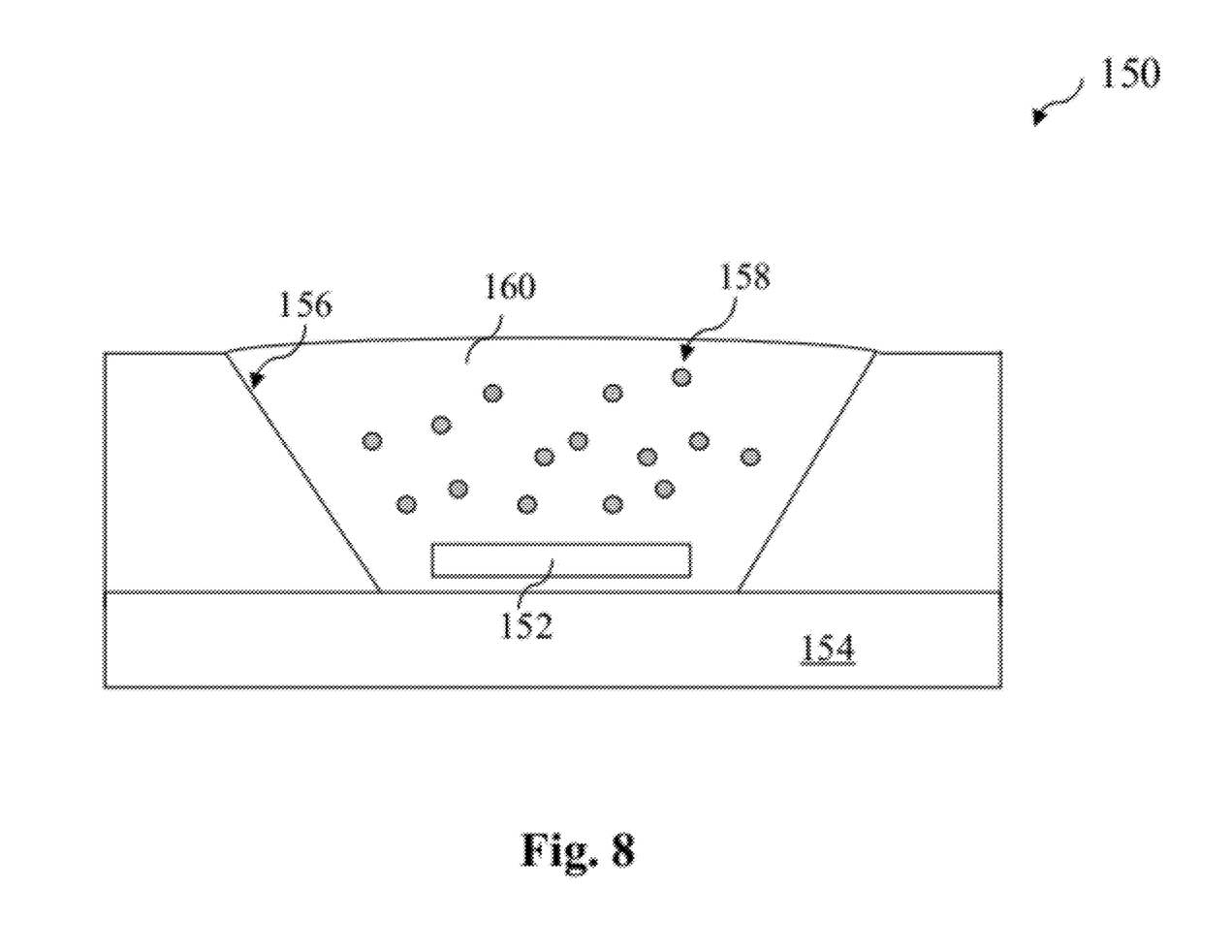
FIG. 8 is a diagrammatic view of a radiation device having the luminescent material formed by the method of FIG. 1.
Figure 9:
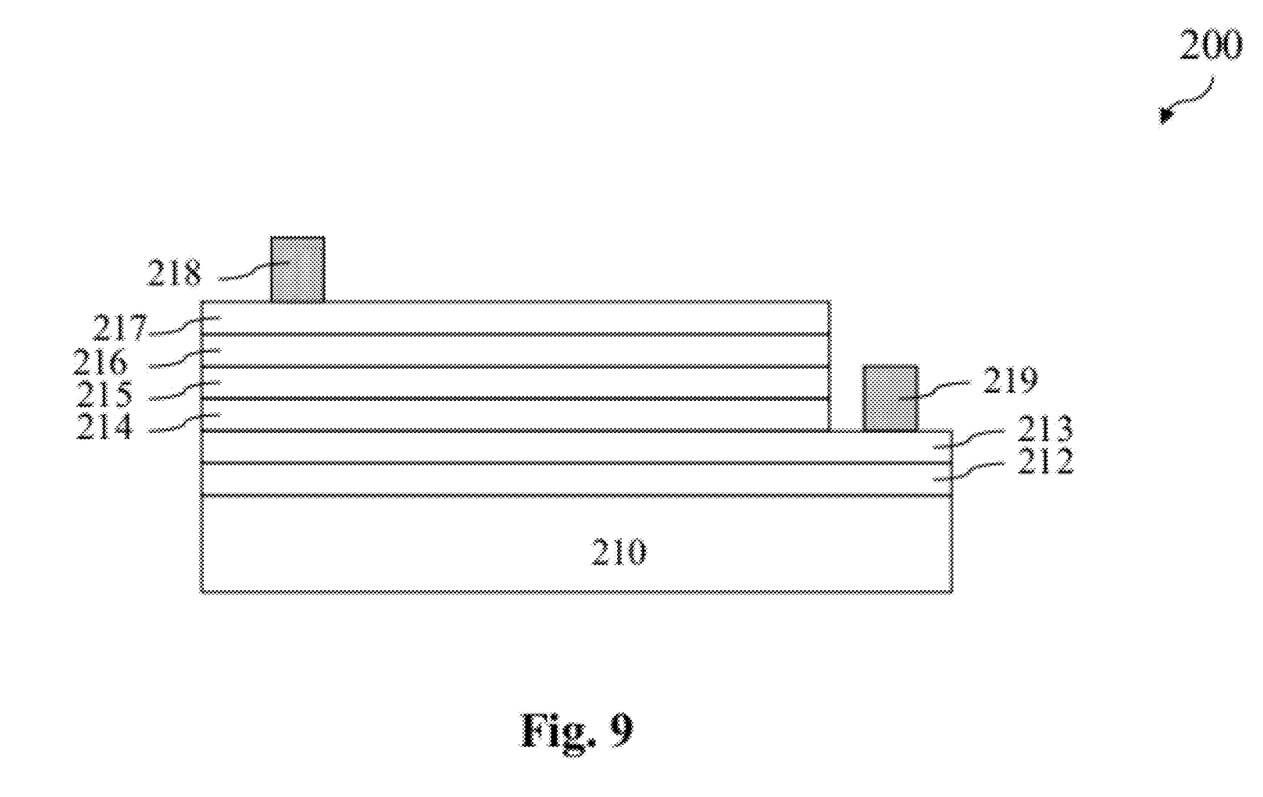
FIG. 9 is a diagrammatic view of a light-emitting diode (LED) used in the radiation device of FIG. 8.

FIG. 2 is a flowchart of a method 110 for making a radiation device. FIG. 8 is a diagrammatic view of one embodiment of a radiation device 150 using the luminescent material prepared by the method 100 of FIG. 1. FIG. 9 is a diagrammatic view of one embodiment of a light-emitting diode (LED) 200 used in the radiation device of FIG. 8. With reference to FIGS. 2, 8, and 9, the radiation device 150 and the method 110 of making the same are collectively described.

The method 110 begins at step 112 by forming or providing a light-emitting device 152, such as LED 200 of FIG. 8. The LED 200 includes a semiconductor p-n junction that can emit spontaneous radiation in ultraviolet, visual or infrared regions of the electromagnetic spectrum. In the present embodiment, the LED emits blue light having an emission peak ranging from 430 nm to 490 nm, such as 460 nm. The LED 200 is formed on a substrate 210, such as a sapphire, silicon carbide, gallium nitride (GaN), or silicon. In the depicted embodiment, the substrate 210 is a sapphire substrate. In one embodiment, the LED 200 includes an n-type impurity doped cladding layer 213 and a p-type doped cladding layer 215 formed on the n-type doped cladding layer 213. In one embodiment, the n-type cladding layer 213 includes n-type gallium nitride (n-GaN), and the p-type cladding layer 215 includes p-type gallium nitride (p-GaN). Alternatively, the cladding layers may include GaAsP, GaPN, AlInGaAs, GaAsPN, or AlGaAs doped with respective types. The LED 200 may further include an indium gallium nitride/gallium nitride (InGaN/GaN) multi-quantum well layer 214 disposed between the n-GaN 213 and p-GaN 215. The LED 200 may further include a buffer layer 212, such as a GaN buffer layer, formed between the sapphire substrate 210 and the n-GaN 213. The LED 200 may further include an InGaN/GaN layer 216 formed on the p-GaN 216. A transparent conductive layer 217, such as indium tin oxide (ITO), is formed on the p-GaN 215, coupled to a p-electrode 218. An n-electrode 219 is formed and coupled with the n-GaN layer 213.

The LED is provided for only illustration and may vary in various applications. Further, the light emitting device 152 is not limited to the LED. Other types of light emitting devices may be additionally or alternatively formed or used. The light-emitting device 152 may include other features such as drive circuit integrated in an integrated circuit chip.

Referring back to FIGS. 2 and 8, the method 110 proceeds to step 114 by attaching the light-emitting device 152 to a support substrate 154. The support substrate 154 includes a conductive material, such as copper or aluminum. The light-emitting device 152 is attached to the support substrate 154 through an adhesive layer, such as a conductive adhesive layer. In one or more examples, the light-emitting device 152 is attached to the support substrate 154 through a silver paste or solder. In various embodiments, with reference to FIG. 9, the LED 200 as the light-emitting device 152 is configured with the substrate 154 such that the p-electrode 218 and the n-electrode 219 are properly routed to power lines. In another embodiment, one or more reflective surfaces 156 are configured to the support substrate 154 to effectively reflect light and enhance radiation efficiency.

Still referring to FIGS. 2 and 8, the method 110 proceeds to step 116 by forming or providing a luminescent material 158 (or phosphor). The phosphor 158 is formed by the method 100. The luminescent material 158 is formed or provided in powder. The luminescent material 158 emits red light under blue excitation and is also referred to as a blue-to-red nitridosilicate phosphor. The blue-to-red nitridosilicate phosphor 158 is a $Ce^{3+}$ doped or $Ce^{3+}$,$Li^+$ co-doped luminescent material. In one embodiments, the nitridosilicate phosphors 158 has a composition with a formula of $M_{x-z}Si_yN_{2/3x+11/9y}:RE_z$, where M=Ca, Sr, or Ba; parameters x, y and z satisfy 0<z<x<y; and RE is rare earth element(s) $Ce^{3+}$, or $Ce^{3+}$ and $Li^+$. In one example, the phosphor 158 includes cerium doped ($Ce^{3+}$) strontium nitridosilicate, $Sr_{1-x}Si_6N_8:Ce^{3+}_x$, where the parameter x ranges between about 0.01 to about 0.1. In another example, the phosphor 158 includes cerium and lithium co-doped ($Ce^{3+}$, $Li^+$)strontium nitridosilicate, $Sr_{1-2x}Si_6N_8:Ce^{3+}_x$, $Li^+_x$, where the parameter x ranges between about 0.01 to about 0.1.

Still referring to FIGS. 2 and 8, the method 110 proceeds to step 118 by distributing the luminescent material 158 around the light-emitting device 152. In one embodiment, the luminescent material 158 is dispersed in epoxy 160 disposed around the light-emitting device 152, as illustrated in FIG. 8. In another embodiment, the luminescent material 158 is directly disposed on the light-emitting device 152. In yet another embodiment, the luminescent material 158 is remotely disposed around the light-emitting device 152. For example, the luminescent material 152 is separated from the light-emitting device 152 by an encapsulation material. The method 110 may further include other processing steps such as other packaging steps.

Thus, the present disclosure provides an illuminating system including a light emitting device; and a luminescent material disposed approximate the light-emitting device. The luminescent material includes a strontium silicon nitride ($SrSi_6N_8$) doped by either cerium ($Ce^{3+}$), or cerium ($Ce^{3+}$) and lithium ($Li^+$).

In one embodiment, the strontium silicon nitride is doped by cerium, formulated as $Sr_{1-x}Si_6N_8:Ce^{3+}_x$. The parameter x ranges between about 0.01 and about 0.5 in one embodiment. In another embodiment, the strontium silicon nitride is doped by cerium and lithium, formulated as $Sr_{1-2x}Si_6N_8:Ce^{3+}_x$, $Li^{3+}_x$. The parameter x ranges between about 0.01 and about 0.5 in one embodiment. The luminescent material emits blue light excited by ultraviolet (UV) light and emits red light excited by blue light. In one embodiment, the luminescent material includes an excitation spectrum having a peak ranging from 430 nm to 490 nm. In yet another embodiment, the luminescent material is embedded in epoxy around the LED. In yet another embodiment, the luminescent material is powered and dispersed in the epoxy. In yet another embodiment, the light emitting device includes an emission spectrum with a peak ranging from 430 nm to 490 nm. In yet another embodiment, the light-emitting diode includes an indium gallium nitride (InGaN) LED.

The present disclosure also provides an embodiment of a luminescent material including a rare earth element doped nitridosilicate phosphor formulated as $M_{x-z}Si_yN_{2/3x+11/9y}:RE_z$, where M is one of calcium (Ca), strontium (Sr), and barium (Ba); x, y and z satisfy 0<z<x<y; and RE is either cerium ($Ce^{3+}$), or cerium ($Ce^{3+}$) and lithium ($Li^+$). In one embodiment, the rare earth element doped nitridosilicate phosphor includes a strontium silicon nitride ($SrSi_6N_8$) doped by one of a first dopant having cerium ($Ce^{3+}$), formulated as $Sr_{1-x}Si_6N_8:Ce^{3+}_x$; and a second dopant having cerium and lithium ($Ce_{3+}$, $Li_+$), formulated as $Sr_{1-2x}Si_6N_8:Ce^{3+}_x$, $Li^{3+}_x$. The parameter x ranges between about 0.01 and about 0.1. In another embodiment, the luminescent material includes an excitation spectrum peak ranging from 430 nm to 490 nm. In another embodiment, the luminescent material includes an excitation spectrum peak ranging from 300 nm to 420 nm.

The present disclosure also provides a method including mixing stoichiometrically powdered strontium nitride ($Sr_3N_2$), silicon nitride ($Si_3N_4$), and cerium oxide ($CeO_2$), forming a mixture; and sintering the mixture under a high pressure and a high temperature, forming a luminescent material having a strontium silicon nitride ($SrSi_6N_8$) doped by cerium ($Ce^{3+}$).

In one embodiment, the high pressure is equal to or greater than about 0.9 MPa under a nitrogen atmosphere. In another embodiment, the high temperature ranges between about 1800° C. and about 2000° C.; and the sintering includes a sintering duration greater than about 0.5 hour. In yet another embodiment, the mixing stoichiometrically powdered strontium nitride ($Sr_3N_2$), silicon nitride ($Si_3N_4$), and cerium oxide ($CeO_2$) includes additionally mixing lithium nitride ($Li_3N$) into the mixture, forming the strontium silicon nitride ($SrSi_6N_8$) doped by cerium ($Ce^{3+}$) and lithium ($Li^+$). In yet another embodiment, the mixing stoichiometrically powdered strontium nitride ($Sr_3N_2$), silicon nitride ($Si_3N_4$), cerium oxide ($CeO_2$), and lithium nitride ($Li_3N$) includes mixing powdered strontium nitride ($Sr_3N_2$), silicon nitride ($Si_3N_4$), cerium oxide ($CeO_2$), and lithium nitride ($Li_3N$) with weights by percentage as about 25.16 to about 20.47, about 74.29 to about 74.06, about 0.46 to about 4.55, and about 0.09 to about 0.92, respectively. In one example, the powdered strontium nitride ($Sr_3N_2$), silicon nitride ($Si_3N_4$), cerium oxide ($CeO_2$), and lithium nitride ($Li_3N$) are mixed with weights by percentage as 25.16, 74.29, 0.46, and 0.09, respectively. The formed phosphor is formulated as $Sr_{1-2x}Si_6N_8$: $Ce^{3+}{}_x$, $Li^3{}_x$, where x is about 0.01. In another example, the powdered strontium nitride ($Sr_3N_2$), silicon nitride ($Si_3N_4$), cerium oxide ($CeO_2$), and lithium nitride ($Li_3N$) are mixed with weights by percentage as 20.47, 74.06, 4.55, and 0.92, respectively. The formed phosphor is formulated as $Sr_{1-2x}Si_6N_8$: $Ce^{3+}{}_x$, $Li^{3+}{}_x$, where x is about 0.1. In other examples, the powdered strontium nitride ($Sr_3N_2$), silicon nitride ($Si_3N_4$), cerium oxide ($CeO_2$), and lithium nitride ($Li_3N$) are mixed in the above ranges, respectively, forming a phosphor formulated as $Sr_{1-2x}Si_6N_8$: $Ce^{3+}{}_x$, $Li^{3+}{}_x$, where x is between 0.01 and 0.1.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   mixing stoichiometrically powdered strontium nitride ($Sr_3N_2$), silicon nitride ($Si_3N_4$), and cerium oxide ($CeO_2$) and lithium nitride ($Li_3N$), thereby forming a mixture; and
   sintering the mixture under a high pressure and a high temperature, thereby forming a luminescent material having a cerium ($Ce^{3+}$) and lithium ($Li^+$) co-doped strontium silicon nitride ($SrSi_6N_8$).

2. The method of claim 1, wherein the high pressure is equal to or greater than about 0.9 MPa under a nitrogen atmosphere.

3. The method of claim 1, wherein the high temperature ranges between about 1800° C. and about 2000° C., and the sintering includes a sintering duration greater than about 0.5 hour.

4. The method of claim 1, wherein the mixing stoichiometrically powdered strontium nitride ($Sr_3N_2$), silicon nitride ($Si_3N_4$), cerium oxide ($CeO_2$), and lithium nitride ($Li_3N$) includes mixing powdered strontium nitride ($Sr_3N_2$), silicon nitride ($Si_3N_4$), cerium oxide ($CeO_2$), and lithium nitride ($Li_3N$) with weights by percentage of about 25.16 to about 20.47, about 74.29 to about 74.06, about 0.46 to about 4.55, and about 0.09 to about 0.92, respectively.

5. An illuminating system comprising:
   a light emitting device; and
   a luminescent material disposed approximate the light-emitting device, wherein the luminescent material includes a cerium ($Ce^{3+}$) and lithium ($Li^{30}$) co-doped strontium silicon nitride ($SrSi_6N_8$).

6. The illuminating system of claim 5, wherein the strontium silicon nitride is activated by cerium and lithium, formulated as $Sr_{1-2x}Si_6N_8$: $Ce^{3+}{}_x$, $Li^{3+}{}_x$.

7. The illuminating system of claim 6, wherein x ranges between about 0.01 and about 0.5.

8. The illuminating system of claim 5, wherein the luminescent material emits blue light excited by ultraviolet (UV) light and emits red light excited by blue light.

9. The illuminating system of claim 5, wherein the luminescent material has an excitation spectrum with a peak ranging from 430 am to 490 nm.

10. The illuminating system of claim 5, wherein the luminescent material is embedded in epoxy around the LED.

11. The illuminating system of claim 10, wherein the luminescent material is powered and dispersed in the epoxy.

12. The illuminating system of claim 5, wherein the light-emitting device includes an emission spectrum with a peak ranging from 430 nm to 490 nm.

13. The illuminating system of claim 5, wherein the light-emitting device includes an indium gallium nitride (InGaN) LED.

14. A luminescent material comprising:
   a rare earth element co-doped nitridosilicate phosphor formulated as $M_{x-z}Si_yN_{2/3x+11/9y}$:$RE_z$;
   where M is one of calcium (Ca), strontium (Sr), and barium (Ba);
   x, y, and z satisfy $0 < z < x < y$; and
   RE is a dopant having cerium ($Ce^{3+}$) and lithium ($Li^+$).

15. The luminescent material of claim 14, wherein the rare earth element doped nitridosilicate phosphor includes:
   a strontium silicon nitride ($SrSi_6N_8$) doped by a dopant having cerium and lithium ($Ce_{3+}$, $Li_+$) formulated as $Sr_{1-2x}Si_6N_8$: $Ce^{3+}{}_x$, $Li^{3+}{}_x$, wherein x ranges between about 0.01 and about 0.1.

16. The luminescent material of claim 14, comprising an excitation spectrum peak ranging from 430 nm to 490 nm.

17. The luminescent material of claim 14, comprising an excitation spectrum peak ranging from 300 nm to 420 nm.

* * * * *